(12) United States Patent
Osanai

(10) Patent No.: US 6,653,694 B1
(45) Date of Patent: Nov. 25, 2003

(54) REFERENCE VOLTAGE SEMICONDUCTOR

(75) Inventor: Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/956,309

(22) Filed: Sep. 19, 2001

(30) Foreign Application Priority Data

Sep. 19, 2000 (JP) .................................. 2000-283201
Sep. 13, 2001 (JP) .................................. 2001-278384

(51) Int. Cl.$^7$ .................. H01L 29/76; H01L 29/94; H01L 31/062; H01L 31/113; H01L 31/119
(52) U.S. Cl. .................. 257/392; 438/217; 438/276
(58) Field of Search .................. 257/213, 214, 257/392, 288, 368, 369; 438/75, 144, 76, 146, 276, 282, 289, 291, 217

(56) References Cited

U.S. PATENT DOCUMENTS

| | | | | |
|---|---|---|---|---|
| 4,743,841 A | * | 5/1988 | Takeuchi | 324/73 |
| 5,407,865 A | * | 4/1995 | Glovatsky et al. | 437/212 |
| 5,612,557 A | * | 3/1997 | Kondo et al. | 257/288 |
| 5,793,321 A | * | 8/1998 | Shou et al. | 341/155 |
| 5,797,999 A | * | 8/1998 | Sannomiya et al. | 136/258 |
| 5,835,387 A | * | 11/1998 | Shou et al. | 364/606 |
| 6,025,219 A | * | 2/2000 | Kinoshita | 438/202 |
| 6,139,791 A | * | 10/2000 | Chen et al. | 264/642 |
| 6,373,097 B1 | * | 4/2002 | Werner | 257/329 |

FOREIGN PATENT DOCUMENTS

JP         05235353 A      * 9/1993

* cited by examiner

*Primary Examiner*—Long Pham
*Assistant Examiner*—Dana Farahani
(74) *Attorney, Agent, or Firm*—Adams & Wilks

(57) ABSTRACT

A reference voltage circuit with a small change in output voltage with respect to temperature change has an enhancement mode MOS and a depletion mod MOS, a polarity of a gate of the enhancement mod MOS is opposite that of the transistor, and a polarity of a gate of the depletion mode MOS is the same as that of the transistor, and both the enhancement mode MOS and the depletion mode MOS are of the buried channel type. A dose amount of a counter channel doping impurity for setting a predetermined threshold is substantially the same for the enhancement mode MOS and the depletion mode MOS. Thus, threshold voltages and degrees of change of mutual conductance with temperature can be made the same for both MOS transistors and it is possible to provide the reference voltage circuit with a small change of the output voltage with respect to a temperature change.

10 Claims, 10 Drawing Sheets

REFERENCE VOLTAGE SEMICONDUCTOR

BACKGROUND OF THE INVENTION

1. Field of the Invention

The present invention relates to a semiconductor device including a reference voltage circuit such as a voltage detector (hereinafter referred to as VD) or a voltage regulator (hereinafter referred to as VR).

2. Description of the Related Art

FIG. 18 is a schematic cross sectional view of a reference voltage circuit of a conventional semiconductor device, and FIG. 4 is a circuit diagram of the reference voltage circuit. The reference voltage circuit is a circuit for always outputting a constant voltage with respect to the potential of a low voltage supply terminal from an output terminal irrespective of a voltage applied to a high voltage supply terminal.

The reference voltage circuit is constituted of an enhancement type (hereinafter referred to as E-type) N-channel MOS (hereinafter referred to as NMOS) and a depletion type (hereinafter referred to as D-type) NMOS in series connection. In the E-type NMOS, a gate and a drain are short-circuited with each other, and a source is connected to the low voltage supply terminal. In the D-type NMOS, a source and a gate are connected to each other, and a drain is connected to the high voltage supply terminal. The drain of the E-type NMOS and the source of the D-type NMOS are connected with each other, and the output terminal is provided thereto.

In the above-described reference voltage circuit of the conventional semiconductor device, N+polycrystalline silicon is used for the polarities of the gate electrodes of the E-type NMOS and the D-type NMOS as shown in FIG. 18 because of the easiness of manufacture and the stability. in this case, the E-type is a surface channel and the D-type is a buried channel based on the relationship of working function between a gate and a well. The small change of an output voltage to the temperature change is given as important characteristics of the reference voltage circuit. However, the threshold voltage of MOS and the degree of the change to the temperature change of mutual conductance largely differ between the surface channel and the buried channel. As a result, there is a problem in that it is difficult to make the change of the output voltage to the temperature change smaller.

SUMMARY OF THE INVENTION

The present invention has been made in view of the above, and an object of the present invention is therefore to provide a reference voltage circuit with small fluctuation of an output voltage to a change of temperature and a method of manufacturing the same.

In order to solve the above-described problem, the present invention uses the following means.

(1)

There is provided a semiconductor device comprising a reference voltage circuit in which a gate and a drain of an enhancement MOS transistor of one conductivity type in which the gate and the drain are short-circuited are connected to a gate and a source of a depletion MOS transistor of one conductivity type in which the gate and the source are short-circuited and a connection point thereof is used as an output node, characterized in that a polarity of a gate electrode of the enhancement MOS transistor of one conductivity type is opposite conductivity type and a polarity of a gate electrode of the depletion MOS transistor of one conductivity type is one conductivity type.

(2)

There is provided a semiconductor device comprising a reference voltage circuit in which a source of an enhancement MOS transistor of one conductivity type in which a gate and a drain are short-circuited is connected to a drain of a depletion MOS transistor of one conductivity type in which a gate and a source are short-circuited and a connection point thereof is used as an output node, characterized in that a polarity of a gate electrode of the enhancement MOS transistor of one conductivity type is opposite conductivity type and a polarity of a gate electrode of the depletion MOS transistor of one conductivity type is one conductivity type.

(3)

There is provided a semiconductor device comprising a reference voltage circuit in which a gate and a drain of an enhancement MOS transistor of one conductivity type in which the gate and the drain are short-circuited are connected to a source of a depletion MOS transistor of one conductivity type in which a gate is short-circuited with a source of the enhancement MOS transistor of one conductivity type and a connection point thereof is used as an output node, characterized in that a polarity of a gate electrode of the enhancement MOS transistor of one conductivity type is opposite conductivity type and a polarity of a gate electrode of the depletion MOS transistor of one conductivity type is one conductivity type.

(4)

There is provided a semiconductor device comprising a reference voltage circuit in which a drain of a depletion MOS transistor of one conductivity type in which a gate and a source are short-circuited is connected to a drain and a gate of a first enhancement MOS transistor of opposite conductivity type in which a source is connected to a power supply, a drain of a second enhancement MOS transistor of opposite conductivity type in which a source is connected to the power supply and a gate is connected commonly with the first enhancement MOS transistor of opposite conductivity type is connected to a gate and a drain of an enhancement MOS transistor of one conductivity type in which the gate and the drain are short-circuited, and a connection point thereof is used as an output node, characterized in that a polarity of a gate electrode of the enhancement MOS transistor of one conductivity type is opposite conductivity type and a polarity of a gate electrode of the depletion MOS transistor of one conductivity type is one conductivity type.

(5)

There is provided a semiconductor device comprising a reference voltage circuit in which a drain of a first depletion MOS transistor of one conductivity type in which a gate and a source are short-circuited is connected to a gate and a source of a second depletion MOS transistor of one conductivity type in which the gate and the source are short-circuited, a drain of the second depletion MOS transistor of one conductivity type is connected to a power supply, the source of the first depletion MOS transistor of one conductivity type is connected to an enhancement MOS transistor of one conductivity type in which a gate and a drain are short-circuited, and a connection point thereof is used as an output node, characterized in that a polarity of a gate electrode of the enhancement MOS transistor of one conductivity type is opposite conductivity type and polarities of gate electrodes of the first depletion MOS transistor of one conductivity type and the second depletion MOS transistor of one conductivity type are one conductivity type.

(6)

There is provided a semiconductor device comprising a reference voltage circuit in which a gate and a drain of an enhancement MOS transistor of one conductivity type in which the gate and the drain are short-circuited are connected to a source of a first depletion MOS transistor of one conductivity type in which a gate is short-circuited with a source of the enhancement MOS transistor of one conductivity type, a drain of the first depletion MOS transistor of one conductivity type is connected to a gate and a source of a second depletion MOS transistor of one conductivity type in which the gate and the source are short-circuited, a drain of the second depletion MOS transistor of one conductivity type is connected to a power supply, and a connection point of the drain of the enhancement MOS transistor of one conductivity type and the source of the first depletion MOS transistor of one conductivity type is used as an output node, characterized in that a polarity of a gate electrode of the enhancement MOS transistor of one conductivity type is opposite conductivity type and polarities of gate electrodes of the first depletion MOS transistor of one conductivity type and the second depletion MOS transistor of one conductivity type are one conductivity type.

(7)

There is provided a semiconductor device, characterized in that the gates of the enhancement MOS transistor of one conductivity type and the depletion MOS transistor of one conductivity type are formed of polycrystalline silicon.

(8)

There is provided a semiconductor device, characterized in that the gates of the enhancement MOS transistor of one conductivity type and the depletion MOS transistor of one conductivity type are formed of a lamination structure of polycrystalline silicon and high melting point metal silicide.

(9)

There is provided a semiconductor device, characterized in that polarities of gate electrodes of the first enhancement MOS transistor of opposite conductivity type and the second enhancement MOS transistor of opposite conductivity type are opposite conductivity type.

(10)

There is provided a method of manufacturing a semiconductor device, characterized by comprising the steps of:

forming an element isolating region on a semiconductor substrate;

forming a gate insulating film on the semiconductor substrate;

doping an impurity into the semiconductor substrate for threshold control;

forming a polycrystalline silicon film on the semiconductor substrate;

selectively forming a region of one conductivity type at high concentration in the polycrystalline silicon film;

selectively forming a region of opposite conductivity type at high concentration in the polycrystalline silicon film;

forming an insulating film on the polycrystalline silicon film;

patterning the insulating film and the polycrystalline silicon film to form a gate electrode; and forming regions to be a source and a drain of a MOS transistor.

(11)

There is provided a method of manufacturing a semiconductor device, characterized by comprising the steps of:

forming an element isolating region on a semiconductor substrate;

forming a gate insulating film on the semiconductor substrate;

doping an impurity into the semiconductor substrate for threshold control;

forming a polycrystalline silicon film on the semiconductor substrate;

selectively forming a region of one conductivity type at high concentration in the polycrystalline silicon film;

selectively forming a region of opposite conductivity type at high concentration in the polycrystalline silicon film;

forming high melting point metal silicide on the polycrystalline silicon film;

forming an insulating film on the high melting point metal silicide;

patterning the insulating film, the high melting point metal silicide and the polycrystalline silicon film to form a gate electrode; and forming regions to be a source and a drain of a MOS transistor.

(12)

There is provided a method of manufacturing a semiconductor device, characterized in that the step of doping an impurity for threshold control is conducted by an ion injection method, and the impurity has the same conductivity type as a MOS transistor.

(13)

There is provided a method of manufacturing a semiconductor device, characterized in that the insulating film is a silicon oxide film formed by a chemical vapor deposition method or a thermal oxidization method, and the thickness of the insulating film is in a range of 1000 Å to 2000 Å.

(14)

There is provided a method of manufacturing a semiconductor device, characterized in that the insulating film is a silicon nitride film formed by a chemical vapor deposition method, and the thickness of the insulating film is in a range of 1000 Å to 2000 Å.

(15)

There is provided a method of manufacturing a semiconductor device, characterized in that the high melting point metal silicide is one of molybdenum silicide, tungsten silicide, titanium silicide and platinum silicide and is formed by a chemical vapor deposition method or a sputtering method.

(16)

There is provided a method of manufacturing a semiconductor device, characterized in that the high melting point metal silicide is a substance in which cobalt or titanium formed on the polycrystalline silicon by a sputtering method is silicified.

BRIEF DESCRIPTION OF THE DRAWINGS

In the accompanying drawings

DETAILED DESCRIPTION OF THE PREFERRED EMBODIMENTS

Embodiments of the present invention are described with reference to the accompanying drawings.

Figure 1:
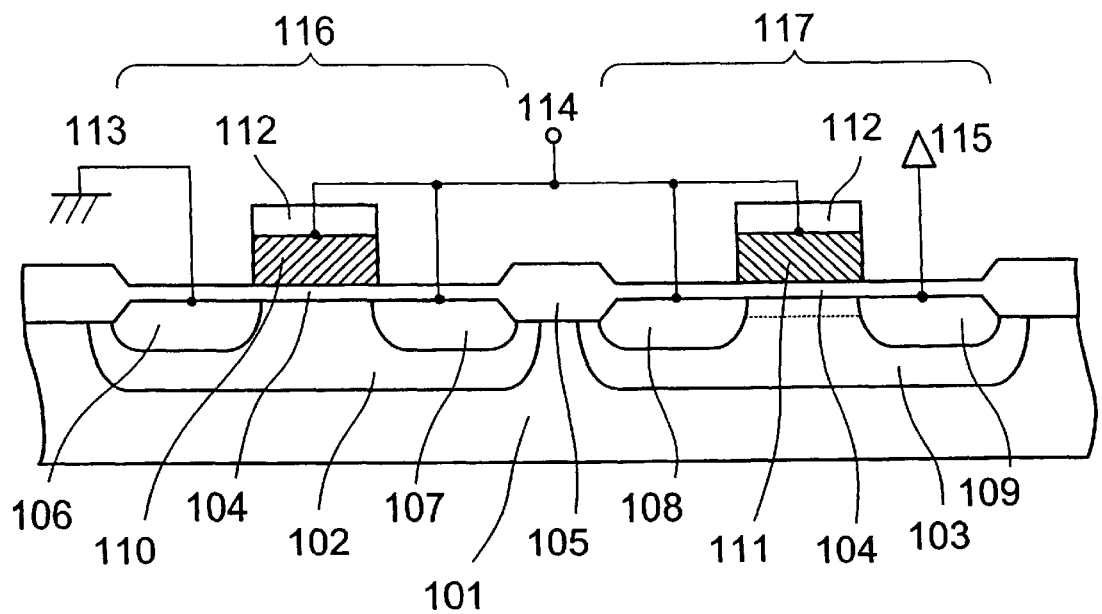
FIG. 1 is a schematic cross sectional view showing an embodiment of a reference voltage circuit according to a semiconductor device of the present invention.
Figure 3:
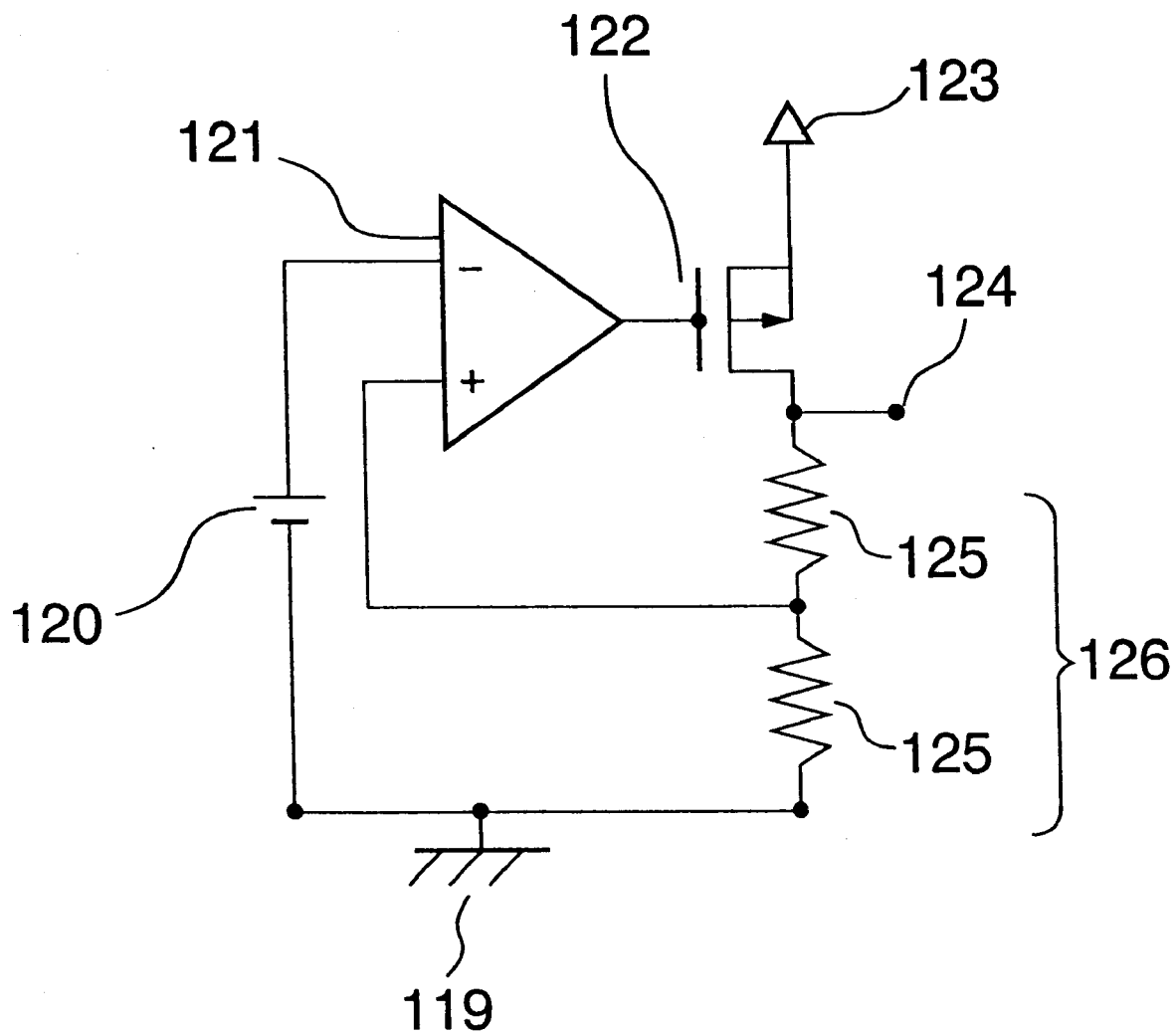
FIG. 3 shows a positive VR circuit according to the semiconductor device.

FIG. 1 is a schematic cross sectional view showing a first embodiment of a reference voltage circuit according to the present invention which is used in, for example, a positive VR circuit of a semiconductor device which is shown in FIG. 3. In this embodiment, there is shown an example of a reference voltage circuit in FIG. 4 which is constituted of an E-type NMOS and a D-type NMOS in series connection.

An N-type semiconductor substrate 101 is used, and an E-type NMOS 116 and a D-type NMOS 117 are provided in P-type wells 102 and 103, respectively in order to avoid a back bias effect. The MOSs are constituted of sources 106 and 108, drains 107 and 109, and gate oxide films 104, respectively. A gate of the E-type NMOS is formed of P+polycrystalline silicon 110, and a gate of the D-type NMOS is formed of N+polycrystalline silicon 111.

The drain 107 of the E-type NMOS and the P+polycrystalline silicon 110 that forms the gate are short-circuited with each other by a wiring metal not shown in the figure. Further, the source 106 of the E-type NMOS is connected to a low voltage supply terminal 113 that is a GND line in this embodiment.

The source 106 of the D-type NMOS and the N+polycrystalline silicon 111 that forms a gate are short-circuited with each other by a wiring metal not shown in the figure, and the drain 109 of the D-type NMOS is connected to a high voltage supply terminal 115.

In the present invention, the P+polycrystalline silicon is used for the gate of the E-type NMOS, and the N+polycrystalline silicon is used for the gate of the D-type NMOS. In the case where so-called channel doping by an ion injection method for setting a threshold voltage to a predetermined value is not performed at all, the threshold voltage of the NMOS the gate of which is N+type is 0 V to 0.2 V while the threshold voltage of the NMOS the gate of which is P+type is 1.0 V or more although depending on the thickness of the gate oxide film or the P-well concentration.

The threshold voltage of the E-type NMOS of approximately 0.7 V is used in many cases. In order to set to this threshold voltage, a counter dopant such as phosphorous or arsenic is introduced into semiconductor by a channel doping method in the NMOS using the P-type gate. Thus, a channel of the MOS transistor is formed in the portion with the lowest concentration, and the E-type NMOS is buried channel type.

Further, the threshold voltage of the D-type NMOS of approximately −0.3 V is generally used. In order to set to this threshold voltage, the counter dopant such as phosphorous or arsenic is channel-doped. Thus, the D-type NMOS is also the buried channel type.

Therefore, both the NMOSs are to the buried channel type by using the P-type gate for the E-type NMOS and the N-type gate for the D-type NMOS. Further, both the NMOSs have substantially the same difference between the threshold in case of not conducting channel doping and a predetermined threshold of 1.0 V to 0.7 V in the E-type NMOS and 0.0 V to −0.3 in the D-type NMOS. Thus, the dose amount of an impurity into a channel in a manufacturing process is substantially the same for both the NMOSs. As a result, a channel profile is also substantially the same of the E-type and D-type NMOSs of buried channel type.

As described above, in comparison with the conventional structure in which the D-type NMOS is the buried channel type and the E-type NMOS is surface channel type, the E-type NMOS and the D-type NMOS are the buried channel type MOS transistors with substantially the same channel profiles. Thus, the threshold voltages and the degrees of the change to the mutual conductance temperature of the respective MOSs can be made the same. As a result, the temperature characteristics of the reference voltage circuit can be made flat.

This effect is more conspicuous when counter channel doping of the E-type NMOS and that of the D-type NMOS are simultaneously conducted using the same mask since the channel profiles are completely the same.

Figure 2:
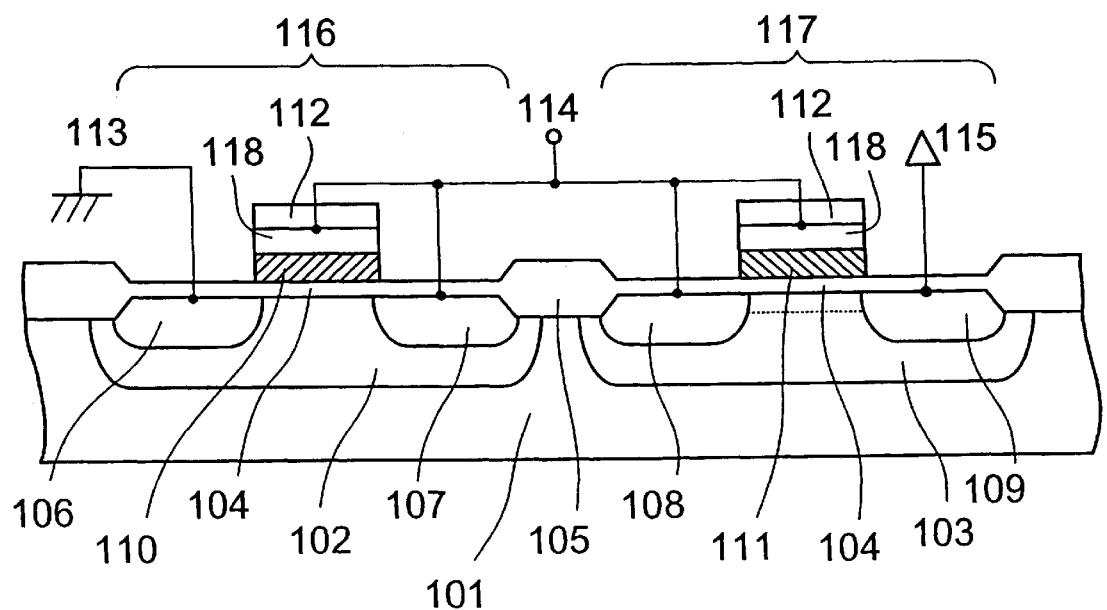
FIG. 2 is a schematic cross sectional view showing an embodiment of a reference voltage circuit according to the semiconductor device of the present invention.

FIG. 2 is a schematic cross sectional view showing a second embodiment of a reference voltage circuit according to the semiconductor device of the present invention.

In order to attain low resistance of a gate electrode, a gate takes a so-called polycide structure that is a lamination structure of high melting point metal silicide such as molybdenum silicide, tungsten silicide, titanium silicide, platinum silicide or cobalt silicide and polycrystalline silicon.

The polycrystalline silicon of the lower layer of the gate electrode is the P+type in the E-type NMOS and the N+type in the D-type NMOS, whereby a reference voltage circuit with the flat temperature characteristics is obtained as in the description of FIG. 1. Further, since the resistance of the gate electrode is lowered, an integrated circuit with higher performance in terms of high speed can be realized in the embodiment shown in FIG. 2.

Figure 4:
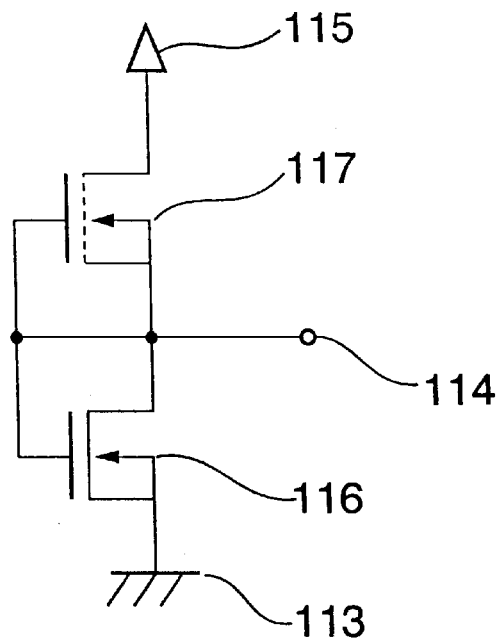
FIG. 4 shows an example of a reference voltage circuit according to the semiconductor device.
Figure 5:
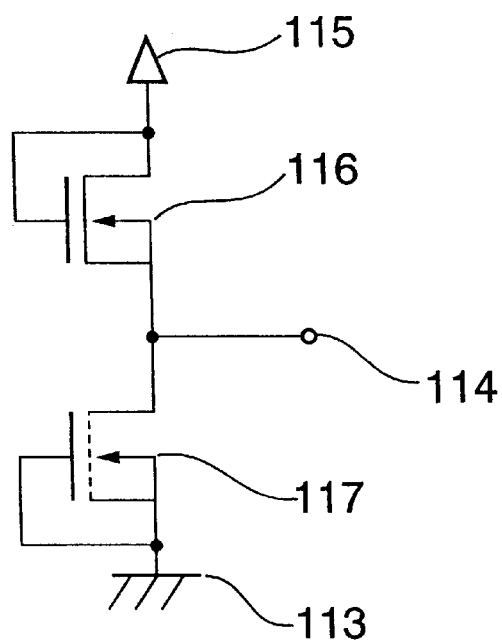
FIG. 5 shows an example of a reference voltage circuit according to the semiconductor device.
Figure 6:
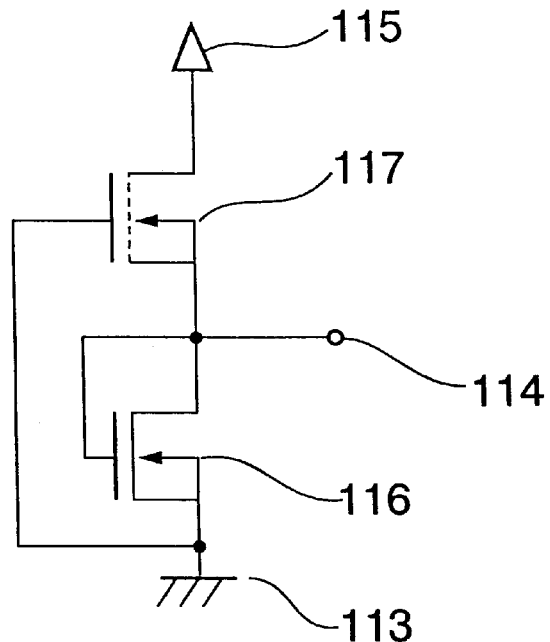
FIG. 6 shows an example of a reference voltage circuit according to the semiconductor device.
Figure 7:
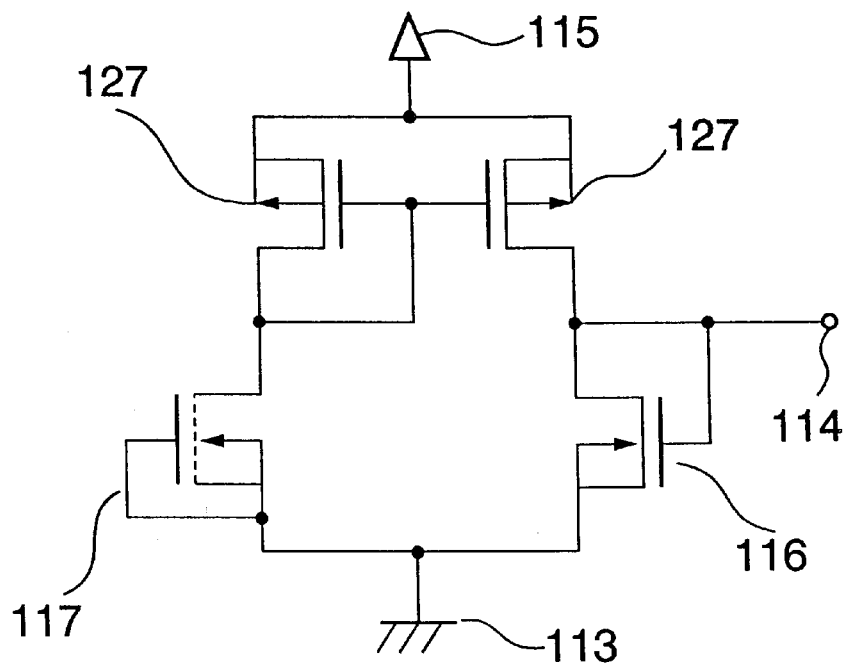
FIG. 7 shows an example of a reference voltage circuit according to the semiconductor device.

The same effect can be obtained by applying the present invention to a reference voltage circuit for outputting a constant voltage to the potential of a high voltage supply terminal in FIG. 5, a reference voltage circuit suitable for a low voltage output in FIG. 6 and a reference voltage circuit used for the purpose of avoiding a back bias effect in case of using a P-type semiconductor substrate in FIG. 7 in addition to the reference voltage circuit in FIG. 4.

In a circuit example of FIG. 7, an E-type PMOS is used as a load element. A gate electrode of this PMOS is set to P+type as the gate electrode of the E-type NMOS, whereby the PMOS is the surface channel type. Thus, even if the threshold is set to be lower in comparison with the buried channel type, a leak current of the PMOS can be suppressed. Therefore, it is possible to provide a reference voltage circuit with low voltage operation and low consumption power.

Figure 8:
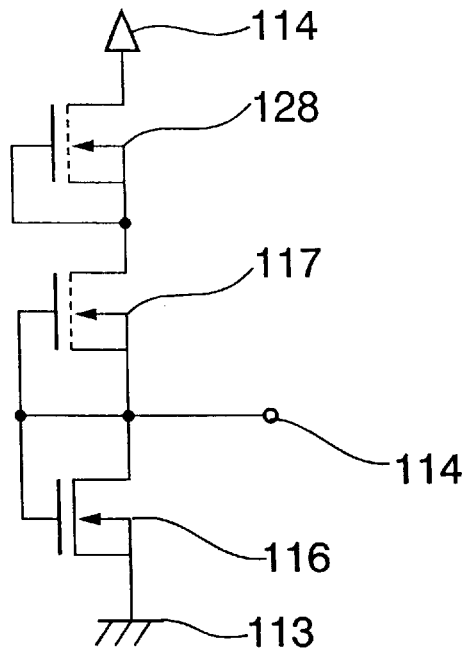
FIG. 8 shows an example of a reference voltage circuit according to the semiconductor device.
Figure 9:
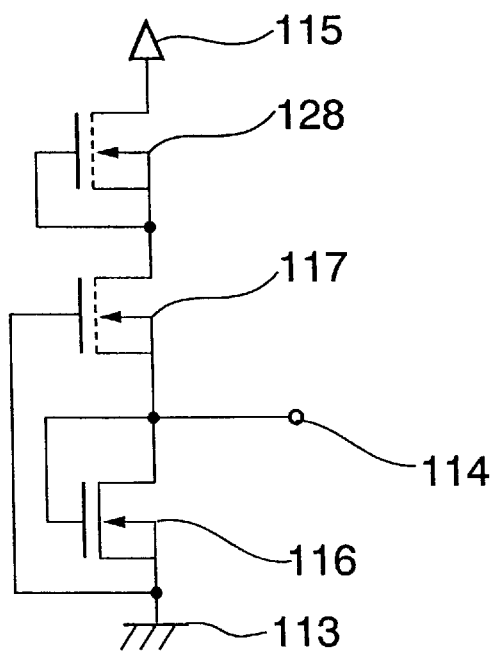
FIG. 9 shows an example of a reference voltage circuit according to the semiconductor device.

Further, according to the present invention, in a circuit for stably outputting a reference voltage, which is not influenced by noise superimposed on a high voltage supply terminal in FIG. 8 and FIG. 9, the same effect can be obtained by making a gate polarity of an E-type NMOS P-type and gate polarities of gate electrodes of two D-type NMOSs N-type.

The embodiment of the present invention is described using the E-type NMOS and the D-type NMOS as described above. However, a reference voltage circuit with satisfactory temperature characteristics can be obtained by using an E-type PMOS comprising an N+gate and a D-type PMOS comprising a P+gate, which are opposite to the E-type NMOS and the D-type NMOS in polarity, as in the embodiment of the NMOS.

In the embodiment mode of the present invention, the description is made using the structure that avoids the back bias effect. However, needless to say, a reference voltage circuit with flat temperature characteristics can be realized in a reference voltage circuit to which the common back bias of the E-type MOS transistor and the D-type MOS transistor is applied.

Next, a method of manufacturing a semiconductor device according to the first embodiment of the present invention is described with reference to the drawings.

Figure 10:
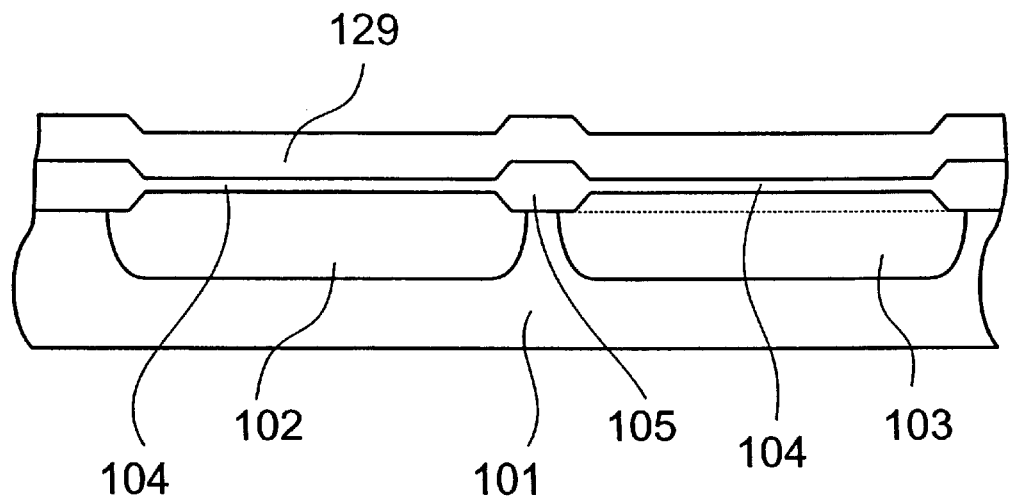
FIG. 10 is a schematic cross sectional view showing a method of manufacturing a semiconductor device according to an embodiment of the present invention.

FIG. 10, after the P-wells 102 and 103 are formed in the N-type semiconductor substrate 101, a field insulating film 105 that is an element isolating region is formed by a so-called LOCOS method, and doping of an impurity into a channel region for threshold control is selectively conducted for the E-type and D-type NMOSs by an ion injection method. Thereafter, the gate insulating film 104 is formed by thermal oxidization in an electric furnace, for example, and then, polycrystalline silicon 129 is deposited thereon.

In this embodiment, a P-well structure using an N-type semiconductor substrate is shown. However, a P-type semiconductor substrate is used for the case where a Vss terminal is made to have the same potential as a mounting tab from the viewpoint of the cost of substrate and in response to the request from a user. In this case as well, the effect of the temperature characteristics of the reference voltage circuit according to the present invention can be obtained as in the case of the N-type semiconductor substrate P-well method in FIG. 10.

The impurity doping into the channel region for threshold control is conducted by the ion injection method as described above. However, as to the conductivity type of the gate electrode, the P+polycrystalline silicon forms the gate electrode of the E-type NMOS and the N+polycrystalline silicon forms the gate electrode of the D-type NMOS, as described later. Thus, a donor such as phosphorous or arsenic is used as a dopant with respect to both the E-type NMOS and the D-type NMOS.

Both the E-type NMOS and the D-type NMOS are of the buried channel type. Since the fluctuation of the threshold voltage is smaller when the impurity profile is close to the surface, arsenic with a small diffusion coefficient is generally used.

Further, as described above, the impurity doping into the channel region for threshold control is selectively conducted for the E-type NMOS and the D-type NMOS by the ion injection method. However, it is possible to simultaneously form both the NMOSs by the same process in accordance with the threshold voltage.

The dose amount of the impurity depends on the value of the predetermined threshold, but is in a range of $10^{11}$ atoms/cm$^2$ to $10^{12}$ atoms/cm$^2$.

Polycrystalline silicon is generally deposited on an oxide film by decomposing silane gas by a chemical vapor deposition method (hereinafter referred to as CVD) under decompression. The thickness is in a range of 2000 Å to 6000 Å.

Figure 11:
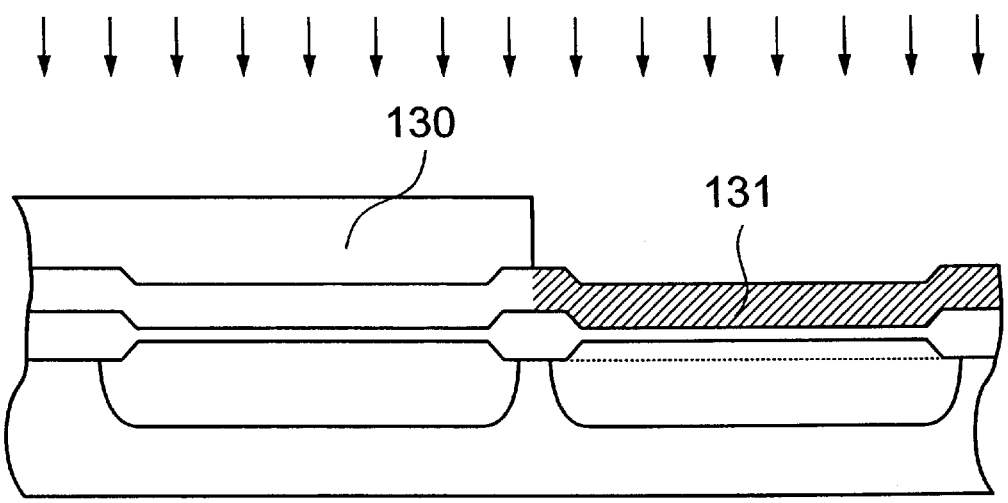
FIG. 11 is a schematic cross sectional view showing the method of manufacturing the semiconductor device according to an embodiment of the present invention.

Next, as shown in FIG. 11, a photo resist 130 is patterned so as to open the portion to be a D-type NMOS by a photolithography method. Then, phosphorous or arsenic as a donor impurity is selectively introduced into the polycrystalline silicon by an ion injection method to form an N+polycrystalline silicon region 131.

Ion injection is generally conducted with the conditions of the concentration of $1 \times 10^{19}$ atoms/cm$^3$ or more and the dose amount of $1 \times 10^{15}$ atoms/cm$^2$ or more.

Figure 12:
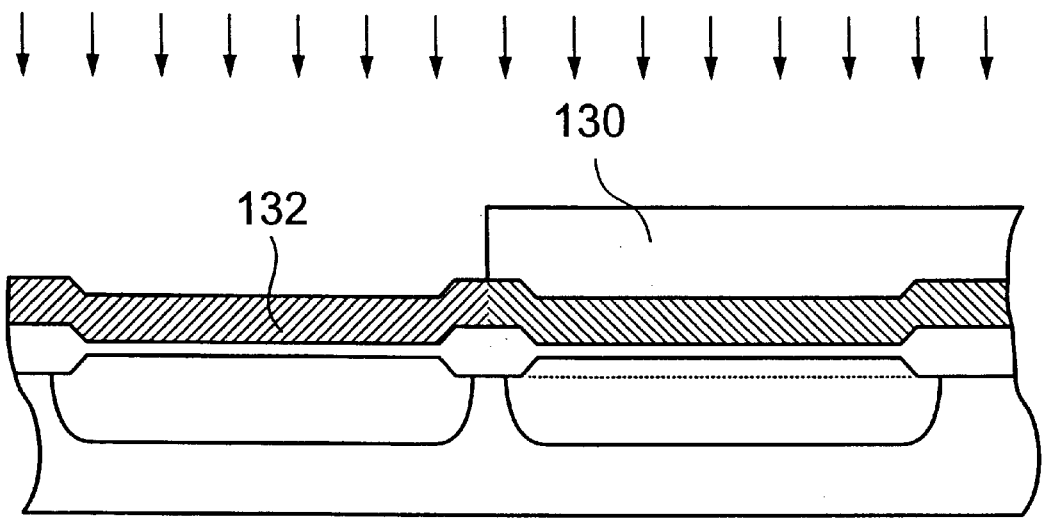
FIG. 12 is a schematic cross sectional view showing the method of manufacturing the semiconductor device according to an embodiment of the present invention.

Next, after the photo resist is peeled off, as shown in FIG. 12, the photo resist 130 is patterned so as to open the portion to be a P+gate electrode of the E-type NMOS by the photolithography method. Then, BF$_2$ as an acceptor impurity is selectively introduced into the polycrystalline silicon by the ion injection method to form a P+polycrystalline silicon region 132.

Since the resistances of the gate electrode and wiring are preferably made to be lower as much as possible, ion injection is conducted with the conditions of the concentration of $1 \times 10^{19}$ atoms/cm$^3$ or more and the dose amount of $1 \times 10^{15}$ atoms/cm$^2$ or more.

Note that the order of steps of FIG. 11 and FIG. 12 is not necessarily adopted. The N+polycrystalline silicon region and the P+polycrystalline silicon region are also formed by exchanging the steps in FIG. 11 and FIG. 12.

Figure 13:
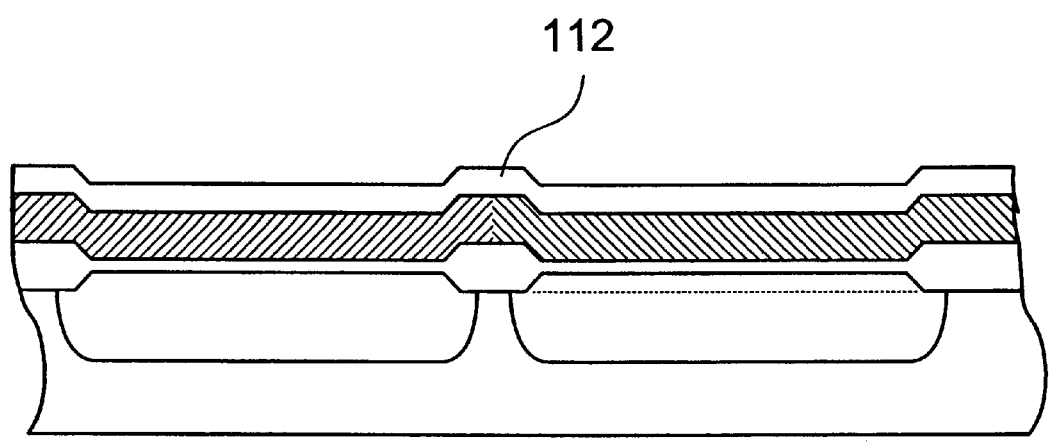
FIG. 13 is a schematic cross sectional view showing the method of manufacturing the semiconductor device according to an embodiment of the present invention.

Next, as shown in FIG. 13, an insulating film 112 is formed on the polycrystalline silicon by a CVD method or a thermal oxidization method. A heat treatment is conducted in an electric furnace with an atmosphere of inert gas such as nitrogen or argon depending on the situation.

The insulating film 112 is provided as a mask for preventing a donor dopant from entering the P+gate electrode when a source and a drain of the NMOS are formed later in a self-aligning manner. Acceleration energy of ion injection in the formation of the source and the drain of the NMOS is lower than 100 Kev in order that the insulating film functions as the mask. Thus, the thickness of 1000 Å to 2000 Å sufficiently enables the prevention even in consideration for the maximum range of ion. An oxide film or a nitride film is used as the material for the insulating film.

Figure 14:
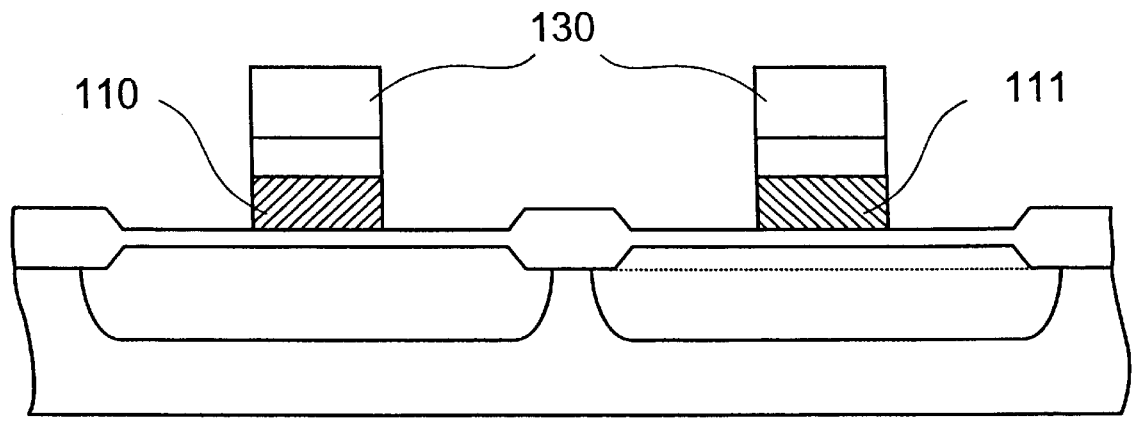
FIG. 14 is a schematic cross sectional view showing the method of manufacturing the semiconductor device according to an embodiment of the present invention.

Next, as shown in FIG. 14, the insulating film and the polycrystalline silicon are patterned by photolithography and etching to form gate electrodes.

The formation is carried out by two methods. One method is such that after the photo resist is patterned by the photolithography method, the insulating film is etched using the photo resist as a mask, then, the polycrystalline silicon is etched while the photo resist is left, and thereafter, the photo resist is removed. The other method is such that after the photo resist is patterned by the photolithography method, the insulating film is etched using the photo resist as a mask, then, the photo resist is peeled off, and thereafter, the polycrystalline silicon is etched using the insulating film as a mask.

Anisotropic dry etching is adopted for the processing of the gate electrode because precision is required. Anisotropic etching is attained by the effect of a side wall defensive film of the product with the photo resist in etching, and thus, in general, the polycrystalline silicon is dry-etched while the photo resist is left.

In the case where the insulating film is an oxide film, the processing can be conducted by either wet etching or dry etching. However, dry etching is more favorable in terms of precision. Further, in the case where the insulating film is a nitride film, patterning with the photo resist as the mask does not have an appropriate wet etchant, and thus, etching is limited to dry etching. However, in case of the nitride film, since the etch rate achieved by dry etching is approximately the same as that of the polycrystalline silicon, there is an advantage in that etching can be continuously conducted in the same etcher.

Figure 15:
FIG. 15 is a schematic cross sectional view showing the method of manufacturing the semiconductor device according to an embodiment of the present invention.
Figure 15:
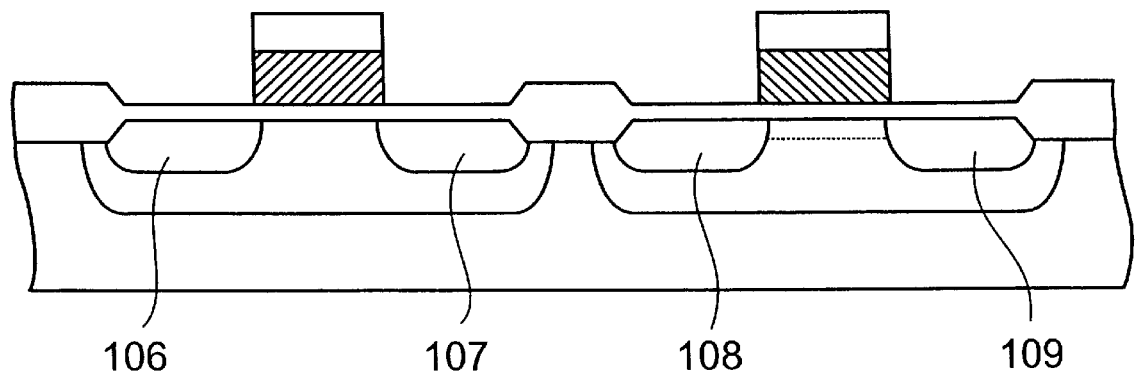

Next, as shown in FIG. 15, although the photo resist itself is not shown in the figure, the photo resist is patterned so as to open the portion to be an NMOS by the photolithography method. Thereafter, a donor such as phosphorous or arsenic is introduced into the P-well at high concentration by the ion injection method to form the sources 106 and 108 and the drains 107 and 109 of the NMOS.

Arsenic having a small diffusion coefficient with which a shallow source and a shallow drain are obtained is generally used as an impurity. The dose amount is $1\times10^{15}$ atoms/cm$^2$ or more in order to make resistance lower as much as possible, and the concentration is $1\times10^{19}$ atoms/cm$^3$ or more in this case.

Further, since the insulating film is provided on the gate electrode of the E-type NMOS in this case, the donor does not enter the P+gate electrode of the E-type NMOS. Thus, the working function does not change.

In the subsequent step, a wiring metal is formed as in the general process of manufacturing a MOS.

As described above, through the steps of FIG. 10 to FIG. 15, the structure of the reference voltage circuit of the semiconductor device according to the first embodiment of the present invention in FIG. 1 is obtained.

The steps shown in FIG. 10 to FIG. 15 are conducted while the insulating film on the N+polycrystalline silicon that forms the gate electrode on the D-type NMOS is left. However, depending on the situation, a step of selectively removing the insulating film on the N+polycrystalline silicon may be conducted after the deposition of the insulating film, and then, the subsequent steps may be conducted.

The number of steps increases, but the donor dopant at the time of the formation of the source and drain can be introduced simultaneously into the N+polycrystalline silicon. Thus, there is a merit that the resistance value of the N+polycrystalline silicon can be lowered.

In the case where the gate electrode shown in FIG. 2 has a so-called polycide structure that is a lamination layer of high melting point metal silicide and polycrystalline silicon, after the steps through the step of FIG. 12 are conducted, the high melting point metal silicide is deposited on the polycrystalline silicon by a sputtering method or a CVD method. Further, an insulating film is deposited on the high melting point metal silicide by the CVD method. Then, the insulating film, the high melting point metal silicide and the polycrystalline silicon are patterned to form a gate electrode as in the step of FIG. 14, and the step of FIG. 15 is conducted. Thus, the semiconductor device is manufactured.

In this case, the polycrystalline silicon has a thickness of 1000 Å to 4000 Å, which is thinner in comparison with the case of a polycrystalline silicon single layer. Molybdenum suicide, tungsten silicide, titanium silicide or platinum silicide is used as the high melting point metal silicide, and the thickness is in a range of about 500 Å to 2500 Å. A sputtering method is generally used for the formation from the viewpoint of adhering property of the high melting point metal silicide and the polycrystalline silicon although there is a fear for damage. The high melting point metal silicide enables the remarkable reduction of the sheet resistance value of the gate electrode and wiring to about several Ù/ to 10 Ù/ in comparison with the sheet resistance value of about several tens of Ù/ of the gate electrode and wiring made of the polycrystalline silicon single layer. Thus, the function of the semiconductor product is improved.

Further, the high melting point metal silicide can be formed as follows. That is, the high melting point metal silicide such as cobalt or titanium is deposited with a thickness of about 100 Å to 500 Å on the polycrystalline silicon by a sputtering method. Then, a heat treatment is conducted thereto for several tens of seconds to 1 minute at about 600° C. to 750° C. by a rapid thermal process (RTP), for example, to thereby silicify the high melting point metal on the polycrystalline silicon. Thereafter, the RTP is conducted for several tens of seconds at about 700° C. to 900° C.

Figure 16:
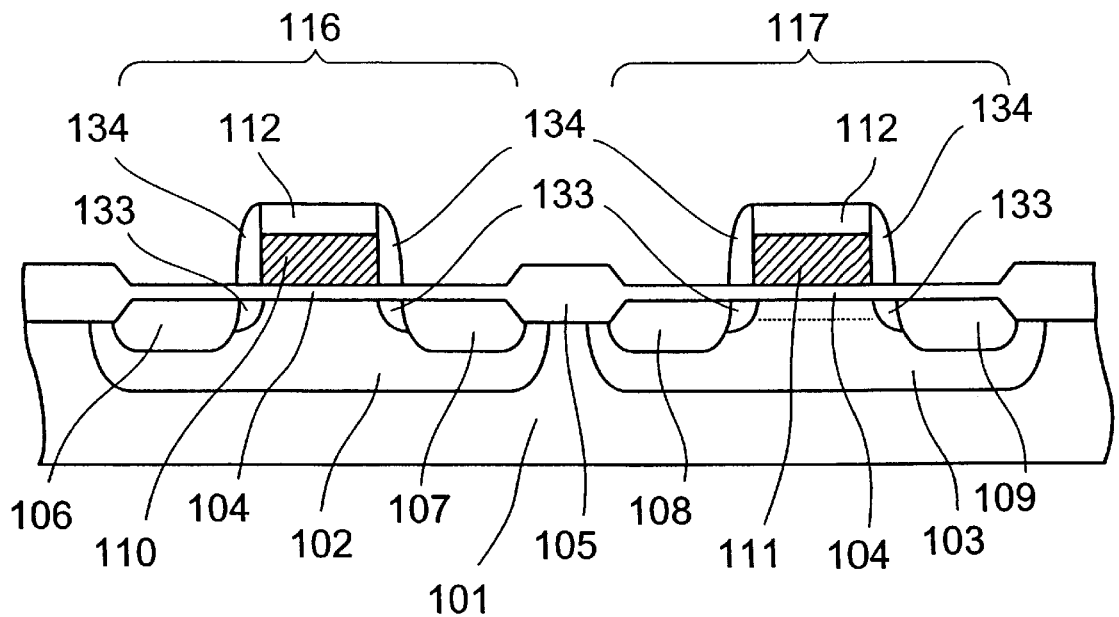
FIG. 16 is a schematic cross sectional view showing a semiconductor device according to an embodiment of the present invention.

FIG. 16 is a schematic cross sectional view of a semiconductor device according to a third embodiment of the present invention. The third embodiment is the same as the embodiments of the present invention in FIG. 1 and FIG. 2 in the point that the gate of the E-type NMOS is formed of the P+polycrystalline silicon 110 and the gate of the D-type NMOS is formed of the N+polycrystalline silicon 111. However, the transistor structure takes a lightly doped drain (LDD) structure having low concentration diffusion regions 133 for the purpose of field relaxation.

The structure in FIG. 16 is the LDD structure, and thus, is the structure advantageous in the fineness of gate length and the improvement of reliability. The other points are the same as in the structure of the polarity of the gate electrode that is the basis of the present invention in FIG. 1 and FIG. 2. Thus, the effect on the temperature characteristics of the reference voltage circuit is the same.

The structure shown in FIG. 16 can be obtained by conducting a general LDD formation process after the steps of FIG. 10 to FIG. 14 are conducted. However, the insulating film 112 provided on the polycrystalline silicon gate needs to be left after the formation of side spacers 134. Thus, it is necessary to use the material for the insulating film which can have an etching selective ratio in comparison with the side spacer material. Since an oxide film is generally used for the side spacers, a nitride film is adopted for the insulating film on the polycrystalline silicon in this case.

Figure 17:
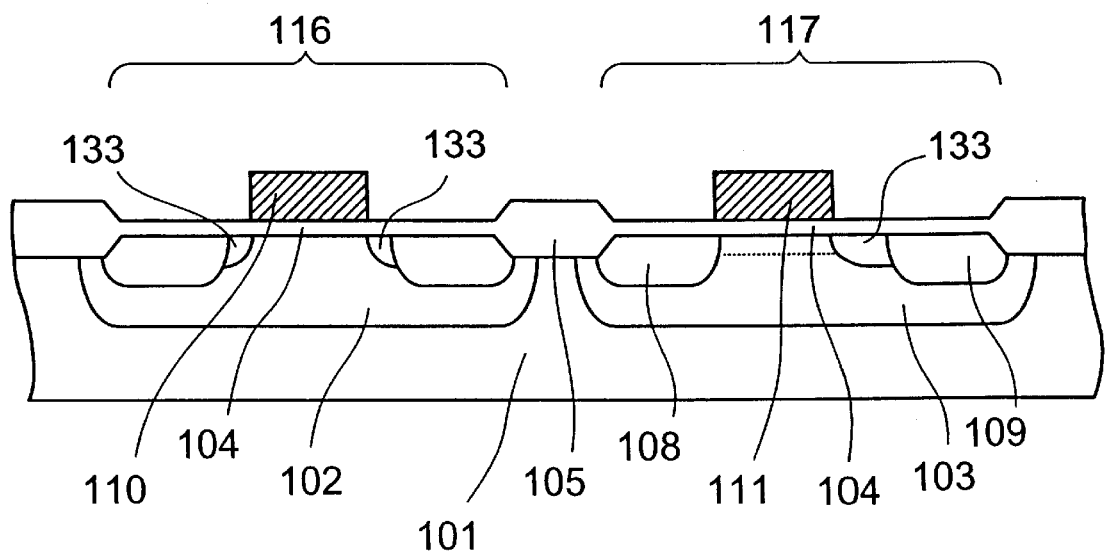
FIG. 17 is a schematic cross sectional view showing a semiconductor device according to an embodiment of the present invention.
Figure 18:
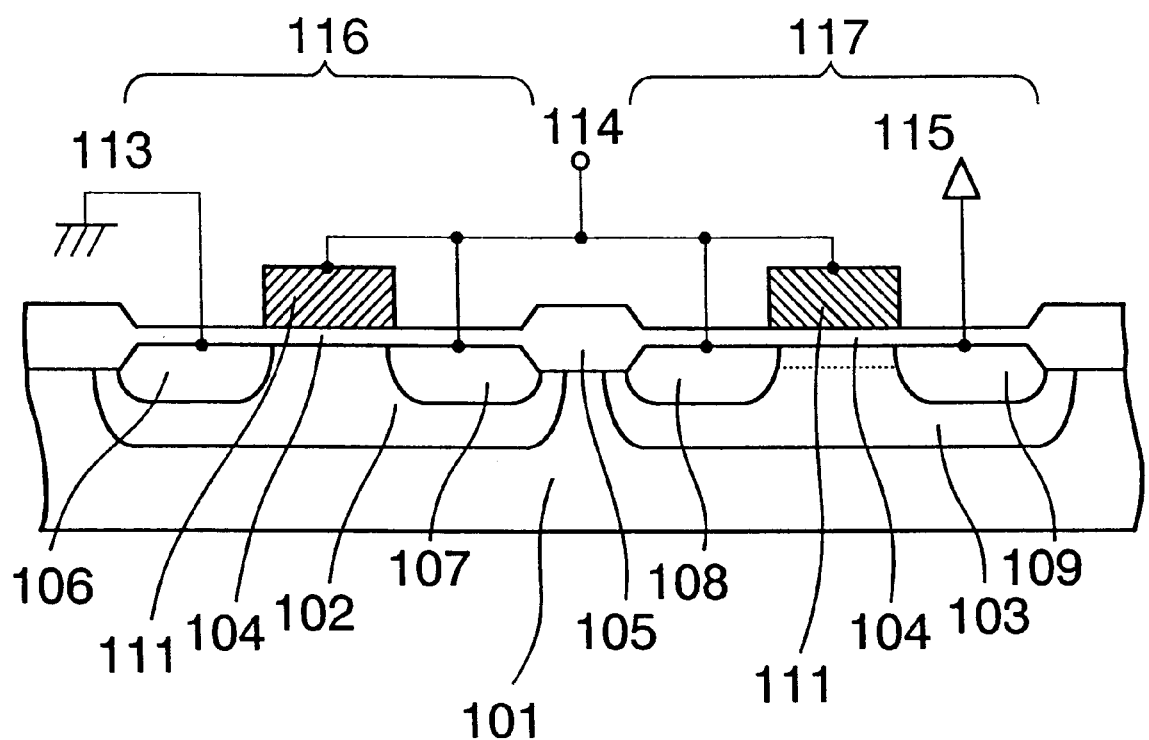
FIG. 18 is a schematic cross sectional view showing a reference voltage circuit of a conventional semiconductor device.

FIG. 17 is a schematic cross sectional view of a semiconductor device according to a fourth embodiment of the present invention. The point that the gate of the E-type NMOS and the gate of the D-type NMOS are formed of the P+polycrystalline silicon 110 and the N+polycrystalline silicon 111, respectively, is the same as in the embodiments of the present invention in FIG. 1 and FIG. 2. However, the transistor structure takes a so-called drain extension structure having the low concentration diffusion regions 133 for the purpose of field relaxation. The purpose of the structure is also for attaining the fineness of gate length and the improvement of reliability as in the LDD structure of FIG. 16. The drain extension structure can be adapted to the structure in which a low concentration diffusion layer is not provided on the source side, which is advantageous in terms of parasitic resistance. The other points are the same as in the structure of the polarity of the gate electrode that is the basis of the present invention in FIG. 1 and FIG. 2. Thus, the effect on the temperature characteristics of the reference voltage circuit is the same.

The structure in FIG. 17 is different from the structures in FIG. 1, FIG. 2 and FIG. 16 in the point that the insulating film is not provided on the polycrystalline silicon gate. This is because ion injection is conducted while the photo resist covers the P+polycrystalline silicon 110 in the formation of the source and drain at high concentration. In the formation of the low concentration regions, the donor impurity is introduced into the P+polycrystalline silicon 110. However, the donor impurity does not influence the concentration of the P+polycrystalline silicon, that is, the working function since the order of the concentration is lower by two to three digits.

The gate electrode is formed of the polycrystalline silicon single layer in FIG. 16 and FIG. 17. However, it is of course possible to adopt the polycide structure shown in FIG. 2.

As described above, in the present invention, in the reference voltage circuit including the E-type MOS and the D-type MOS as its structural components, the polarity of the gate of the E-type MOS is of a conductivity type opposite to that of the transistor, and the polarity of the gate of the D-type MOS is the same conductivity type as the transistor, whereby both the E-type MOS and the D-type MOS are of the buried channel type. Besides, the dose amount of counter channel doping for setting to the predetermined threshold is substantially the same for the E-type MOS and the D-type MOS. Thus, the threshold voltages and the degrees of the change to the temperature change of mutual conductance can be made the same for both the MOSs. Therefore, it is possible to provide the reference voltage circuit with the small change of the output voltage to the temperature change.

What is claimed is:

1. A semiconductor reference voltage generating circuit comprising: an enhancement mode NMOS transistor having a gate and a drain short-circuited to each other; a depletion mode NMOS transistor having a gate and a source short-circuited to each other and connected to the gate and the drain of the enhancement mode MOS transistor; and an output node at a connection point of the gate and drain of the enhancement mode NMOS transistor and the gate and source of the depletion mode NMOS transistor; wherein a gate electrode of the enhancement mode NMOS transistor is P type and a gate electrode of the depletion mode NMOS transistor is N type.

2. A semiconductor reference voltage generating circuit according to claim 1; wherein the gates of the enhancement mode NMOS transistor and the depletion mode NMOS transistor are formed of polycrystalline silicon.

3. A semiconductor reference voltage generating circuit according to claim 1; wherein the gates of the enhancement mode NMOS transistor and the depletion mode NMOS transistor are formed of a laminated film of polycrystalline silicon and high melting point metal silicide.

4. A semiconductor reference voltage generating circuit according to claim 1; wherein channel regions of the enhancement mode NMOS transistor and the depletion mode NMOS transistor have substantially the same impurity profile.

5. A semiconductor reference voltage generating circuit according to claim 1; wherein the enhancement mode NMOS transistor and the depletion mode NMOS transistor are of the buried channel type.

6. A semiconductor reference voltage generating circuit according to claim 1; wherein the enhancement mode NMOS transistor and the depletion mode NMOS transistor are of the buried channel type and have channel regions with substantially the same impurity profile.

7. A reference voltage generating circuit comprising: an enhancement mode MOS transistor of a first conductivity type having a gate and a drain short-circuited to each other; a depletion mode MOS transistor of the first conductivity type having a gate and a source short-circuited to each other and connected to the gate and the drain of the enhancement mode MOS transistor; and an output node at a connection point of the gate and drain of the enhancement mode MOS transistor and the gate and source of the depletion mode MOS transistor; where in a gate electrode of the enhancement mode MOS transistor is of a second conductivity type opposite the first conductivity type, and a gate electrode of the depletion mode MOS transistor is of the first conductivity type.

8. A reference voltage generating circuit according to claim 7; wherein the first conductivity type is N type and the second conductivity type is P type.

9. A reference voltage generating circuit according to claim 8; wherein channel impurity profiles of the enhancement mode MOS transistor and the depletion mode MOS transistor are substantially the same.

10. A reference voltage generating circuit according to claim 7; wherein the enhancement mode MOS transistor and the depletion mode MOS transistor are of the buried channel type.

* * * * *